US006733189B2

(12) United States Patent
Hurt et al.

(10) Patent No.: US 6,733,189 B2
(45) Date of Patent: May 11, 2004

(54) ELECTROOPTICAL TRANSMITTING/ RECEIVING MODULE, AND METHOD FOR PRODUCING THE MODULE

(75) Inventors: Hans Hurt, Regensburg (DE); Gustav Müller, Falkensee (DE); Martin Weigert, Berlin (DE); Josef Wittl, Parsberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/211,082

(22) Filed: Aug. 2, 2002

(65) Prior Publication Data

US 2003/0007749 A1 Jan. 9, 2003

Related U.S. Application Data

(63) Continuation of application No. PCT/DE01/00336, filed on Jan. 26, 2001.

(30) Foreign Application Priority Data

Feb. 2, 2000 (DE) ........................................ 100 04 411

(51) Int. Cl.[7] .......................... G02B 6/42; H04B 10/04; H04B 10/06

(52) U.S. Cl. ............................ 385/92; 385/39; 385/40; 385/89; 385/93; 398/141

(58) Field of Search ......................... 385/39–52, 88–94; 398/140–214

(56) References Cited

U.S. PATENT DOCUMENTS 4,410,469 A * 10/1983 Katagiri et al. ............ 264/1.25
5,040,868 A 8/1991 Waitl et al. .................... 385/33
5,708,743 A * 1/1998 DeAndrea et al. ............ 385/88
5,984,534 A 11/1999 Elderstig et al. .............. 385/90
6,236,786 B1 * 5/2001 Aoki et al. .................... 385/50
6,312,624 B1 11/2001 Kropp ....................... 264/1.25
6,328,484 B1 * 12/2001 Uebbing ...................... 385/93
6,422,766 B1 * 7/2002 Althaus et al. ............... 385/94
6,454,470 B1 * 9/2002 Dwarkin et al. .............. 385/93

FOREIGN PATENT DOCUMENTS

| | | |
|---|---|---|
| DE | 27 03 465 A1 | 8/1977 |
| DE | 138 852 | 11/1979 |
| DE | 31 06 285 C2 | 7/1983 |
| DE | 197 11 138 A1 | 9/1998 |
| DE | 198 10 624 A1 | 9/1999 |
| DE | 198 45 703 A1 | 4/2000 |
| EP | 0 450 560 A3 | 10/1991 |
| EP | 0 658 784 A2 | 6/1995 |
| GB | 2 162 335 A | 1/1986 |

* cited by examiner

*Primary Examiner*—Akm Enayet Ullah
*Assistant Examiner*—Jerry T Rahll
(74) *Attorney, Agent, or Firm*—Laurence A. Greenberg; Werner H. Stemer; Ralph E. Locher

(57) ABSTRACT

An electrooptical transmitting and/or receiving module has a lead frame and an optoelectronic transducer mounted thereon. The lead frame and the optoelectronic transducer are potted by a shaped body made from transparent, formable material. Introduced into the shaped body is a reflector element. A radiation beam emitted by a transmitter, or a received radiation beam to be directed onto a receiver is deflected at a prescribed angle by the reflector element. The module can be used in an electrooptical transmitting and/or receiving unit which is constructed as a sidelooker. A method is also provided for molding the electrooptical transmitting and/or receiving module.

43 Claims, 12 Drawing Sheets

ELECTROOPTICAL TRANSMITTING/ RECEIVING MODULE, AND METHOD FOR PRODUCING THE MODULE

CROSS-REFERENCE TO RELATED APPLICATION

This application is a continuation of copending International Application No. PCT/DE01/00336, filed Jan. 26, 2001, which designated the United States and was not published in English.

BACKGROUND OF THE INVENTION

FIELD OF THE INVENTION

The invention relates to an electrooptical transmitting and/or receiving module, and a method for producing the module. The invention is in the field of the production of electrooptical assemblies or modules that usually have a plug receptacle for connecting and optically coupling suitable coupling partners, for example optical conductors. Also conceivable as coupling partners are other optical or electrooptical elements: e.g. for electrically isolating from a further electrooptical module. For converting electrical signals into optical ones or for converting optical signals into electrical ones, such modules have electrooptical transducers that have a light-emitting (transmitter) or light-sensitive (receiver) region that is also designated as optically active zone within the scope of the present invention. In addition to the electrooptical transformation of the signals, a high coupling efficiency in the case of feeding optical signals into or out of waveguides also requires precise coupling of the signal-exporting and/or signal feeding optical conductors (coupling partners). Light emitting diodes (LEDs) or horizontally radiating laser diodes, for example, are used as transmitters in optical communications engineering. Depending on the construction, these frequently have a large numerical aperture that requires the use of lenses for optical coupling with high efficiency.

Such a transmitting/receiving module is disclosed, for example, in commonly-owned, published, non-prosecuted German Patent Application No. DE 197 11 138 A1, which corresponds to U.S. Pat. No. 6,312,624. In the case of the production method described therein for an electrooptical module, a support, in general a lead frame, is positioned exactly by a positioning element dedicated to the support in a component insertion device in which a transducer is disposed and fixed on the support in the precise relative position in relation to the positioning element. The support is subsequently positioned exactly by the positioning element in a potting mould and surrounded by a formable material with the formation of a shaped body, the shaped body having a functional surface serving the purpose of optical coupling, for example a lens or a stop surface. The transducer can be either a transmitter, such as a semiconductor laser, or a receiver, such as a semiconductor photodiode. In the case of this electrooptical module, it is provided that the radiation beam emitted by a transmitter, or a radiation beam detected by a receiver covers a direct and straight light path between a light entry or light exit surface of the module and the transmitter/receiver. However, this restricts the possibilities of structural implementation of the electrooptical module, since it must always be ensured during production that the light entry or light exit surface of the transmitting or receiving surface of the transducer lie directly opposite. The selection of a specific transmitter, for example a vertically emitting vertical resonator semiconductor laser diode (VCSEL), thereby determines the shape of the module and of the shaped body. Conversely, the shape of the module, in particular the relative position of the lead frame in relation to the light exit side mostly prescribes the type of the transmitter to be used.

SUMMARY OF THE INVENTION

It is accordingly an object of the invention to provide an electrooptical transmitting/receiving module and a method for producing the module that overcome the hereinafore-mentioned disadvantages of the heretofore-known devices and methods of this general type and that ensure a more flexible construction of the module that is independent of the type of transmitter or receiver, is ensured. In particular, an object of the present invention is to specify an electrooptical module and a method for producing the module in which the light of the radiation beam is deflected inside the shaped body.

Consequently, the invention describes an electrooptical transmitting and/or receiving module having a shaped body, a first lead frame, and a reflector element. The shaped body is made from a transparent, formable material. The first lead frame is surrounded by the shaped body at least on a section on which an optoelectronic transducer is mounted. The reflector element is surrounded at least partially by the shaped body and has a reflecting surface that faces the transducer in such a way that it deflects by a predetermined angle a radiation beam in a light path between the transducer and a light entry or light exit side of the module.

In an electrooptical module according to the invention, the described reflector element can reflect a radiation beam emitted by a receiver in the direction of a prescribed light exit surface. Likewise, the described reflector element can deflect in the direction of a receiver a radiation beam launched into the module through a light entrance surface. The reflector element is dispose in a fixed relative position with reference to the transducer, because it is surrounded, together with the transducer or the section on which the transducer is mounted by the transparent, formable material.

Likewise, the invention describes a method for producing an electrooptical module having a shaped body made from a transparent formable material. In the method, an optoelectronic transducer is mounted on a section of a first lead frame. A reflector element having a reflecting surface is positioned in such a way relative to the first lead frame and the optoelectronic transducer that the reflecting surface deflects by a predetermined angle a radiation beam in the light path between the transducer and a provided light entry or light exit side of the module. The shaped body is formed by the virtue of the fact that the first lead frame and the reflector element are potted or encapsulated with the aid of the transparent formable material.

During production of the transmitting and/or receiving module according to the invention, an initially spatially coherent lead frame is formed in a way known per se and provided with optoelectronic transducers on sections provided for the purpose. Only subsequently and mostly between different phases of a casting or injection operation are individual connecting webs between different connecting sections of the lead frame severed. It is thus also possible in the case of the module according to the invention for a plurality of transducers, that is to say in principle an arbitrary number of transmitters and/or receivers, to be mounted on coherent sections of the lead frame or sections of the lead frame separated from one another in the final stage.

As a rule, the reflector element is directed with its reflecting surface with reference to the optoelectronic transducer in such a way that an emitting or a receiving radiation beam describes a light path in which a beam deflection by an angle of 90° is included. Because the shaped body mostly has a cuboid shape, the possibility is thereby created of deflecting an emitted radiation beam at a right angle onto a provided light exit surface of the shaped body. A degree of freedom is thereby gained in selecting between two different semiconductor lasers, specifically, an edge-emitting semiconductor laser and a vertically emitting semiconductor laser, such as a vertical resonator semiconductor laser (VCSEL).

There are various possibilities for producing and positioning the reflector element relative to the lead frame holding the transducer.

In a first embodiment of the present invention, the lead frame holding the transducer and the reflector element are formed from an originally unipartide lead frame. During the potting operation or the encapsulation of the lead frame with the transparent, formable material, it is then possible for the lead frame holding the transducer and the reflector element to be separated from one another. They can also, however, be connected to one another in the final stage of the electrooptical transmitting/receiving module. If, for example, the transmitter is an edge-emitting semiconductor laser that is mounted on an end section of a lead frame, a reflecting surface connected to the end section can be disposed at a spacing from the end section in the direction in which the semiconductor laser emits light. The reflecting surface can assume a 45° angle to the incidence direction of the radiation beam emitted by the semiconductor laser, such that the reflecting surface deflects the radiation beam by a 90° angle. The reflector element can be formed in the case of this embodiment by virtue of the fact that before or after a transmitter emitting in the direction of the plane of the lead frame, such as an edge-emitting semiconductor laser, is mounted on the lead frame a section of the lead frame lying upstream of the light exit surface of the transmitter is bent up until it assumes an angle of, in particular, 45° with the plane of the lead frame.

However, it can also be provided in accordance with the second embodiment that the reflector element is separated straightaway from the lead frame provided with a transducer and is brought into position with its reflecting surface relative to the lead frame or the transducer before the potting or encapsulating operation. This relative positioning can be performed, for example, by a suitable positioning device.

For example, the reflector element can be developed from a second lead frame in the case of which, in order to produce the reflecting surface, a section is bent out of the plane of the second lead frame until it assumes an angle of, in particular, 45° with the plane of the second lead frame.

When producing the electrooptical transmitting/receiving module, it is possible to use a mold. The mold determines the shape and size of the shaped body. After the potting or encapsulating operation, in which the transparent, formable material is introduced into the mold, the mold can be retained as module housing. A plug receptacle for coupling an optical conductor plug can be integrally formed on this housing on the light entry or light exit side. Such a module housing is also known as cavity as interface (CAI). However, it is likewise possible to provide that the mold is removed again after the formation of the shaped body. In this case, as well, it is possible for a plug receptacle, known as a so-called insertion socket, to be formed in the shaped body, in a functional surface thereof which is located on the light entry or light exit side, as is known per se in the prior art, for example DE 197 11 138 A1 as referenced above.

It can also be provided that a positive lens is formed in the transparent, formable material on the light entry or light exit side of the shaped body. For this purpose, the mold has on the provided light entry or light exit side of the module an opening in which there is located a shaped part that corresponds on its inner side to the outer contour of a lens to be formed, and that is removed after the formation of the shaped body.

It is possible to provide a plurality of optoelectronic transducers, for example a transmitter and a receiver, in a common transmitting/receiving module. These can be mounted on a common lead frame or on lead frame sections separated from one another. It can be provided in this case that a transmitter emits a radiation beam on a direct path, that is to say without beam deflection, in the direction of a light exit side, and that a received radiation beam entering the module is deflected by a reflecting surface in the direction of a receiver. Conversely, it can also be provided that a radiation beam emitted by a transmitter is deflected by a reflecting surface of a reflector element and then coupled out, while a received radiation beam is launched and directed straight onto a receiver without beam deflection. In the case of the use of a positive lens, the same positive lens can be used in each case for both radiation beams.

A preferred application of the electrooptical transmitting and/or receiving module according to the invention includes installing it in a compact transmitting and/or receiving unit, which is also designated as sidelooker, because a radiation beam can be launched or coupled out laterally, that is to say in a direction parallel to the plane of the circuit boards. It is possible here, in turn, to distinguish two embodiments from one another. In the first embodiment, the electrooptical transmitting and/or receiving module are constructed as a surface-mountable component (SMT, Surface Mounting Technology). In this case, the individual lead frame sections are guided laterally out of the shaped body and bent downwards around the shaped body in such a way that they form flat connecting sections that lie in a common mounting plane and with which they can be soldered onto a circuit board, for example using the reflow method. In this first embodiment, the lead frame plane is therefore parallel to the plane of the circuit board. In a second embodiment of the transmitting and/or receiving unit, the individual lead frame sections led out on one side of the module are plugged into the circuit board at right angles thereto and are connected to electric conductor tracks on the rear of the circuit board or an intermediate level of metallization of a multilayer circuit board. In the case of both embodiments, it becomes clear how the present invention provides more freedom of configuration by virtue of the fact that, depending on the selection of the embodiment, it is possible arbitrary to select the type of transmitter, and thus, for example, to select between an edge-emitting semiconductor laser and a vertically emitting semiconductor laser.

Other features which are considered as characteristic for the invention are set forth in the appended claims.

Although the invention is illustrated and described herein as embodied in an electrooptical transmitting/receiving module, and a method for producing the module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
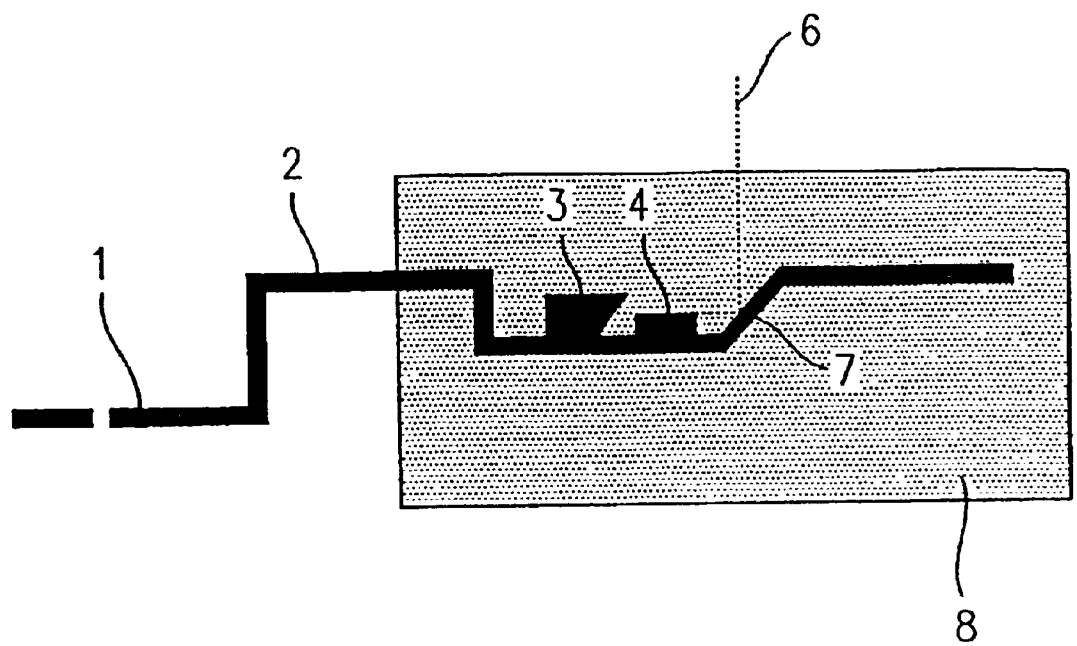
FIG. 1 is a sectional view showing a first, simple embodiment of an electrooptical transmitting and/or receiving module according to the invention.

Referring now to the figures of the drawings in detail and first, particularly to FIG. 1 thereof, there is shown a transmitting and/or receiving module according to the invention having a transmitting assembly from which a transmitting module is constructed. A lead frame 2 having at least one outer connecting pin 1 is formed in a prescribed way and provided, on a section provided therefore, with a transmitter 4, in the present case an edge-emitting semiconductor laser. Outside the cross-sectional plane illustrated here, the lead frame 2 can have yet other connecting sections (not illustrated), which are provided with other optoelectronic transducers and which have been connected to the section of the lead frame 2 illustrated here, or have been separated in the course of the production process, and which in each case have dedicated outer connecting pins. The radiation beam emitted by the transmitter 4 is intended to be deflected in the direction of a provided light exit surface of the module to be fabricated. For this purpose, a reflector element 7 can be produced as early as during the formation of the lead frame 2. The reflector element 7 is produced by bending a section of the lead frame 2 out of a plane. In the present case, the lead frame 2 is bent over to form a line perpendicular to the beam direction, such that the emitted radiation beam strikes an obliquely positioned surface and is reflected thereon. The obliquely positioned, reflecting surface has a 45° angle to the beam direction, such that the radiation beam is deflected by a 90° angle. Since the lead frame is produced from metal, it generally has a sufficiently high reflectivity for the wavelength regions of interest. However, a relatively high reflectivity can also be achieved by suitable measures, as is yet to be shown further below.

The transmitter 4 is applied to the lead frame 2 in a suitable electrically conducting way, for example by using conducting paste or the like. The top side of the transmitter 4 is connected as a rule as a bonding wire to a neighboring lead frame section lying outside the plane of representation of the drawing. This is not shown in the figure, in order to simplify the illustration. Mounted on the lead frame 2 on the side opposite the light exit direction of the radiation beam from the transmitter 4 is a monitoring diode 3. The mounting diode detects the small proportion of the light penetrating from the resonator surface, illuminized on the rear, of the semiconductor laser, and can be used for controlling the current and/or intensity of the semiconductor laser.

After the formation of the lead frame 2 and the reflector element 7, and the mounting of the semiconductor laser 4 and the monitoring diode 3, the configuration is potted or encapsulated with a shaped body 8 made of transparent and formable material, use being made for this purpose in general of a mold having a correspondingly shaped cavity.

The module in accordance with FIG. 1 therefore permits a radiation beam emitted in the plane of the lead frame 2 to be deflected at a right angle and fed along an optical axis 6 of a light exit side of the module. A suitable plug receptacle for an optical conductor plug can be provided on this light exit side, such that the radiation beam can be launched into an optical conductor.

The module in accordance with FIG. 1 is not constructed as a surface-mountable, that is to say SMT-capable module. Instead of this, it is plugged with the aid of the connecting pin 1 into a circuit board and connected on the rear thereof to electrical conductor tracks or, in the case of a multilayer circuit board, to conductor tracks of an inner metallization level. However, it is shown further below how an SMT capable embodiment of a module according to the invention can be produced.

Figure 2A:
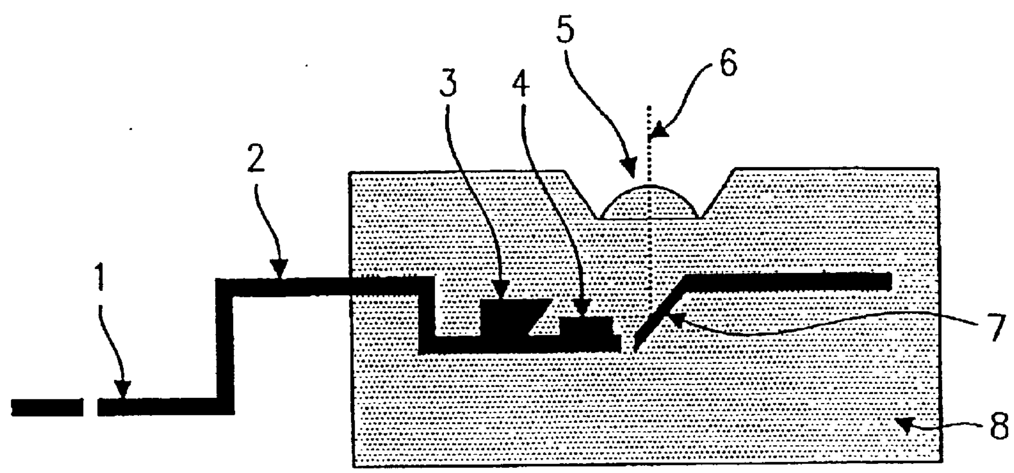
FIGS. 2A and 2B are sectional views showing a second embodiment of a transmitting and/or receiving module according to the invention, along the transmitter plane (FIG. 2A) and along the receiver plane (FIG. 2B)
Figure 2B:
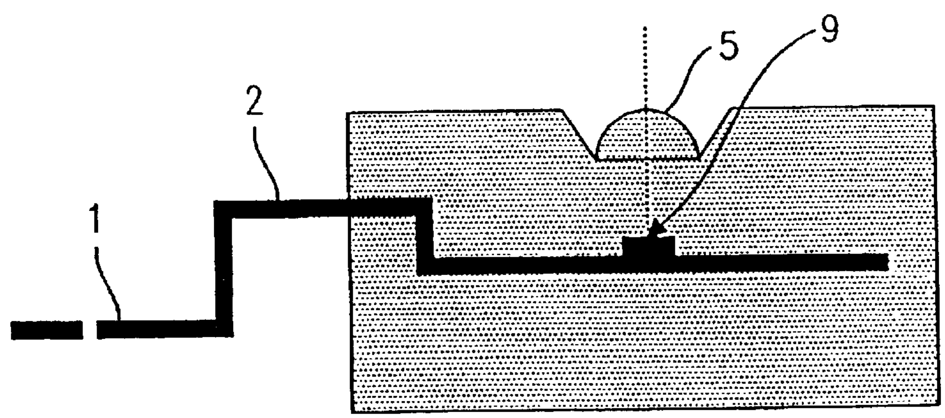
Figure 3:
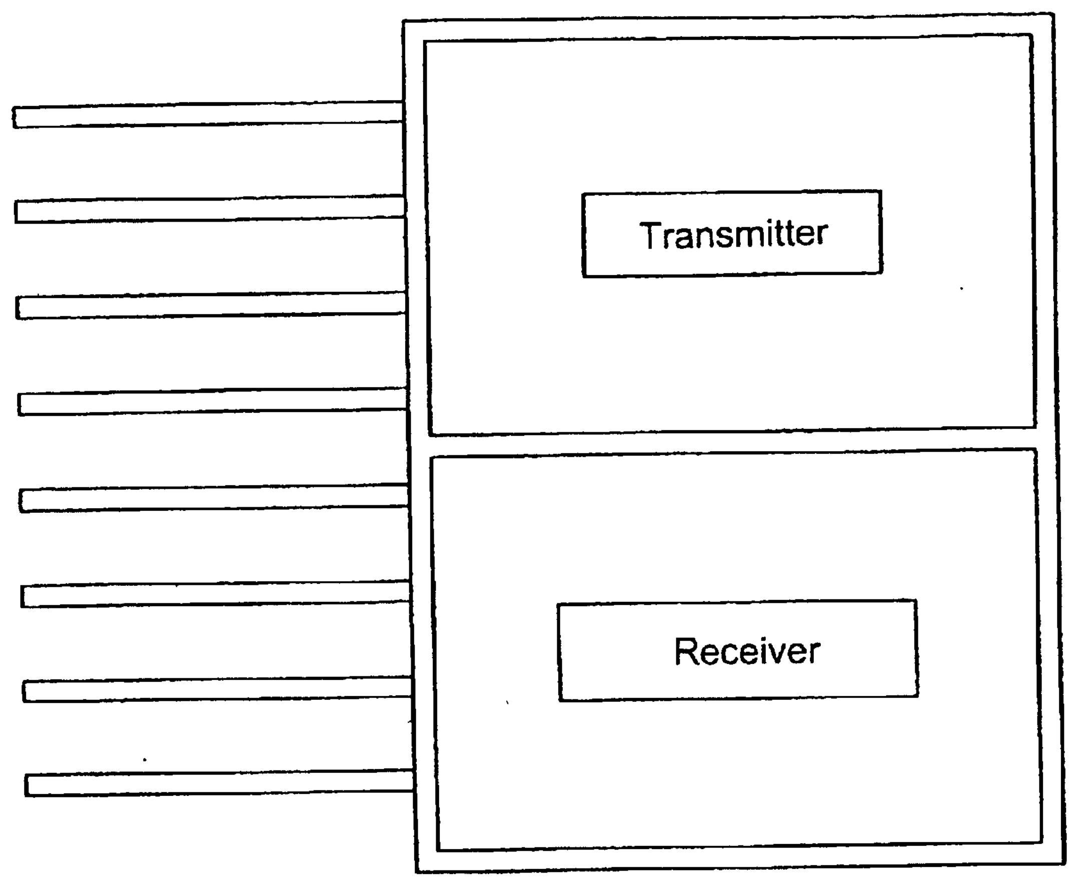
FIG. 3 is a schematic top view showing the electrooptical transmitting and/or receiving module of FIG. 2.

The first aim in the embodiment illustrated in FIGS. 2A, B, and 3 is to show how a transmitter and a receiver can be disposed on a module according to the invention. In the diagrammatic top view of FIG. 3 of this second embodiment of a module according to the invention, a transmitter and a receiver are mounted next to one another on a lead frame or on lead frame sections separated from one another. FIGS. 2A and 2B show cross sections along each lead frame section through the transmitter (A) and the receiver (B). The transmitter plane of the second embodiment differs from the transmitting assembly of the first embodiment (see FIG. 1) with regard two features. Firstly, the lead frame 2 and the reflector element 7 are separated from one another. This can signify, firstly, that these two elements were originally united with one another in a common, unipartide frame, but were separated from one another in the course of the production process. However, it can also signify that the reflector element 7 has been developed from a second lead frame that was spatially separated from the first lead frame from the beginning and was brought into position relative thereto before the potting or encapsulating operation.

The second difference relative to the first embodiment is a positive lens 5 is formed in the shape body 8 on the light exit side of the module. This positive lens 5 can be used to launch a radiation beam emitted by the transmitter 4 into an optical fiber. The production of the positive lens 5 is explained in yet more detail further below (see FIG. 4).

The positive lens 5 simultaneously serves the purpose of focusing a received radiation beam onto a receiver 9, as is shown in FIG. 2B. This shows a section through a plane of another lead frame section of the same lead frame 2 and another connecting pin 1. Mounted on this lead frame section below the positive lens 5 is a receiver 9 such as a semiconductor photodiode. By contrast with the transmitting assembly illustrated in FIG. 2A, the light path in the receiver assembly has no beam deflection. The illustration shows further that the receiver 9 is positioned below the positive lens 5 on the central axis thereof, such that a received radiation beam is substantially launched into the module on the central axis of the positive lens 5. The optical axis 6 of the transmitting assembly illustrated in FIG. 2A is, by contrast, disposed somewhat offset from the central axis of the positive lens 5.

Figure 4:
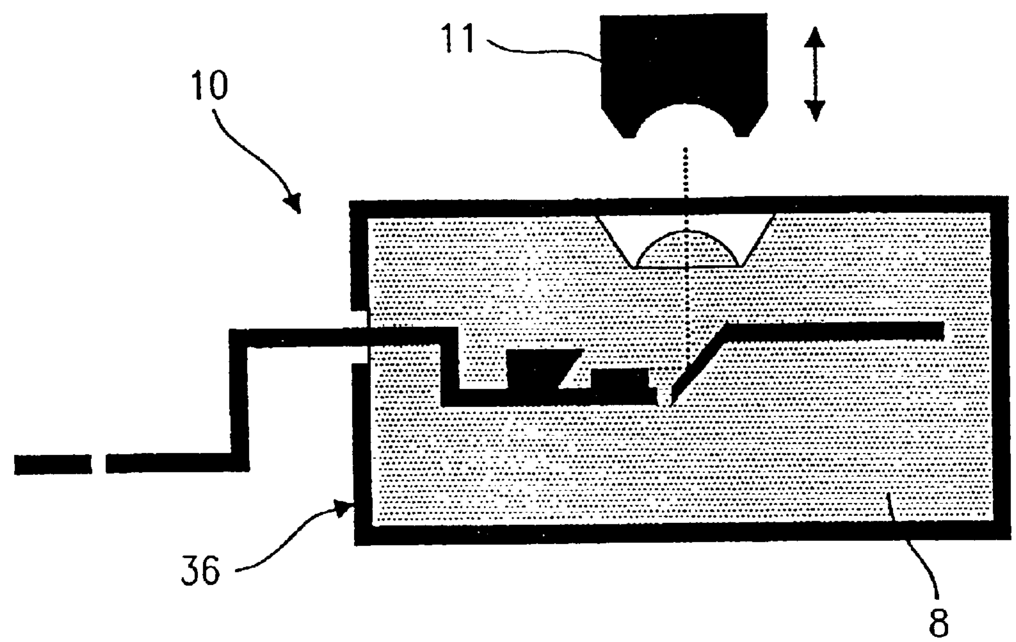
FIG. 4 is a sectional view showing a third embodiment of a transmitting and/or receiving module according to the invention, with module housing.

In the case of the third embodiment, illustrated in FIG. 4, of a transmitting and/or receiving module according to the invention, the shaped body 8 is surrounded by a module housing 36 that encloses on all sides. This module housing 36 can be simultaneously the mold for the shaped body 8, which was left behind on the shaped body 8 after the potting or encapsulating operation. The module housing 36 has an opening for the entry of the lead frame 2 into the shaped body 8. Provided on the light entry or light exit side, in the region of the positive lens 5, is an opening or a transparent window in the module housing 36 for the penetration of the radiation beam. FIG. 4 shows, in addition, how the positive lens 5 can be produced. For this purpose, before the potting or encapsulating operation is carried out a shaped part 11, whose inner side corresponds to the outer contour of the positive lens 5 to be formed, is inserted into the interior of the mold through an opening in the outer wall thereof. After the shaping operation has been carried out, the shaped part 11 is then removed again. A transparent window can then be inserted into the module housing 36 in the region of the positive lens 5 in order to protect the positive lens 5 from its surroundings. In addition, a plug receptacle for fitting an optical conductor plug can be integrally formed in this region. Such a module housing is known per se in the prior art as cavity as interface (CAI).

Figure 5:
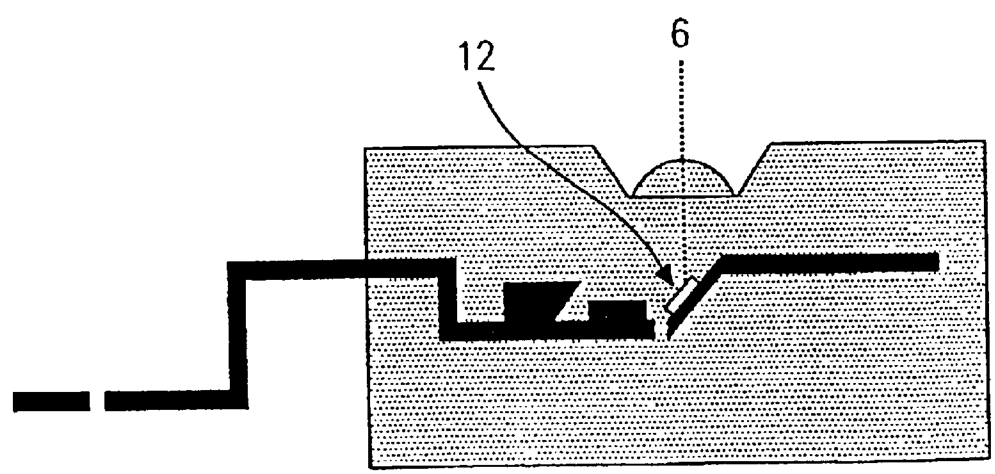
FIG. 5 is a sectional view showing a fourth embodiment of a transmitting and/or receiving module according to the invention, having a reflecting element.

The fourth embodiment, illustrated in FIG. 5, of a transmitting and/or receiving module according to the invention differs from the embodiments illustrated so far in that an additional reflecting element 12 is applied to the reflecting surface of the reflector element 7. It is true, in general, that a reflector element 7 produced from a metallic lead frame has a sufficiently high reflectivity for the wavelength regions of interest. However, it can be desirable or necessary to produce the desired high level of reflectivity by using a reflecting element 12. The latter can either be a reflecting coating made from dielectric layers, for example, or a reflecting chip. In FIG. 5, the reflecting element 12 is fastened on that side of the obliquely positioned surface of the reflector element 7 that faces the transmitter 4. However, it can also be provided that the obliquely positioned surface has a through-opening for the radiation beam such that the reflecting element 12 can also be mounted on that side of the obliquely positioned surface that is averted from the transmitter 4.

Figure 6:
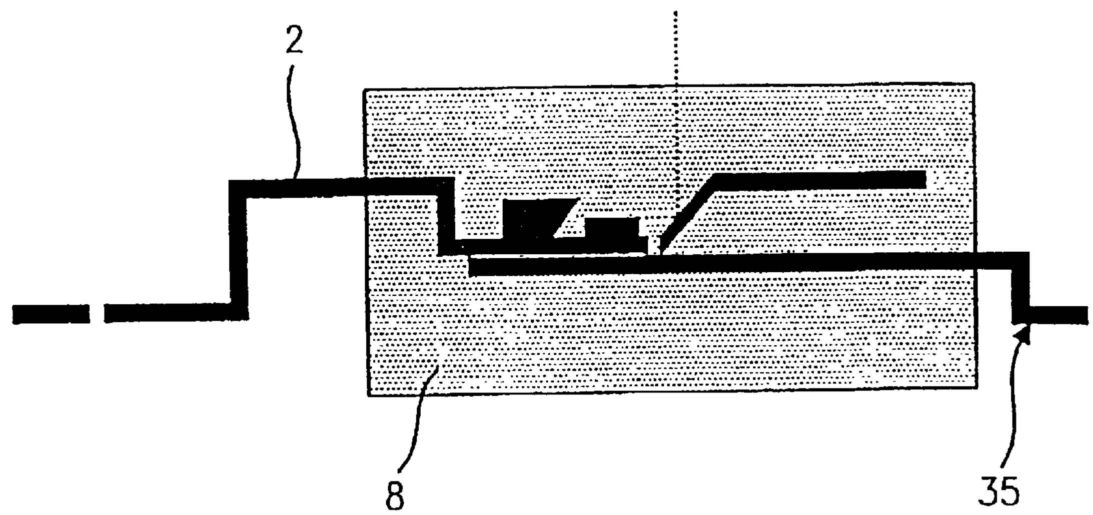
FIG. 6 is a sectional view showing a fifth embodiment of a transmitting and/or receiving module according to the invention, having a heat sink made from a lead frame.
Figure 7:
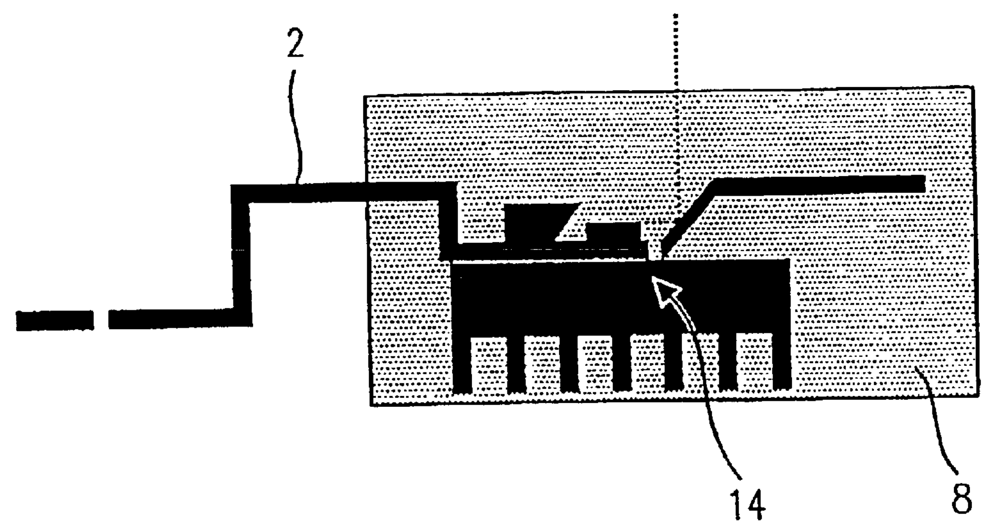
FIG. 7 is a sectional view showing a sixth embodiment of a transmitting and/or receiving module according to the invention, having a heat sink provided with cooling ribs.

Illustrated respectively in FIGS. 6 and 7 are a fifth and a sixth embodiment of a transmitting and/or receiving module according to the invention. In these embodiments, a transmitting assembly is respectively mounted on a heat sink. In the embodiment of FIG. 6, the heat sink 35 is produced from a further lead frame, to which the lead frame 2 with its section carrying the transmitter 4 is applied in a connection which conducts heat effectively. In the case when the module is mounted on a printing circuit board, the heat sink 35 can, if desired, likewise be bound to this circuit board. In the case of the embodiment in FIG. 7, the heat sink 14 is constructed as a heat sink that is provided with cooling ribs and is likewise fastened below the section of the lead frame 2 carrying the transmitter 4, and is not led out of the shaped body 8. However, the heat sink can also partially project from the shaped body.

The heat sinks 14 and 35, illustrated in FIGS. 6 and 7 are preferably connected to the lead frame 2 using welding technology. The heat loss of the semiconductor laser or further mounted chips such as laser drivers, etc., can thereby be exported efficiently.

Figure 8:
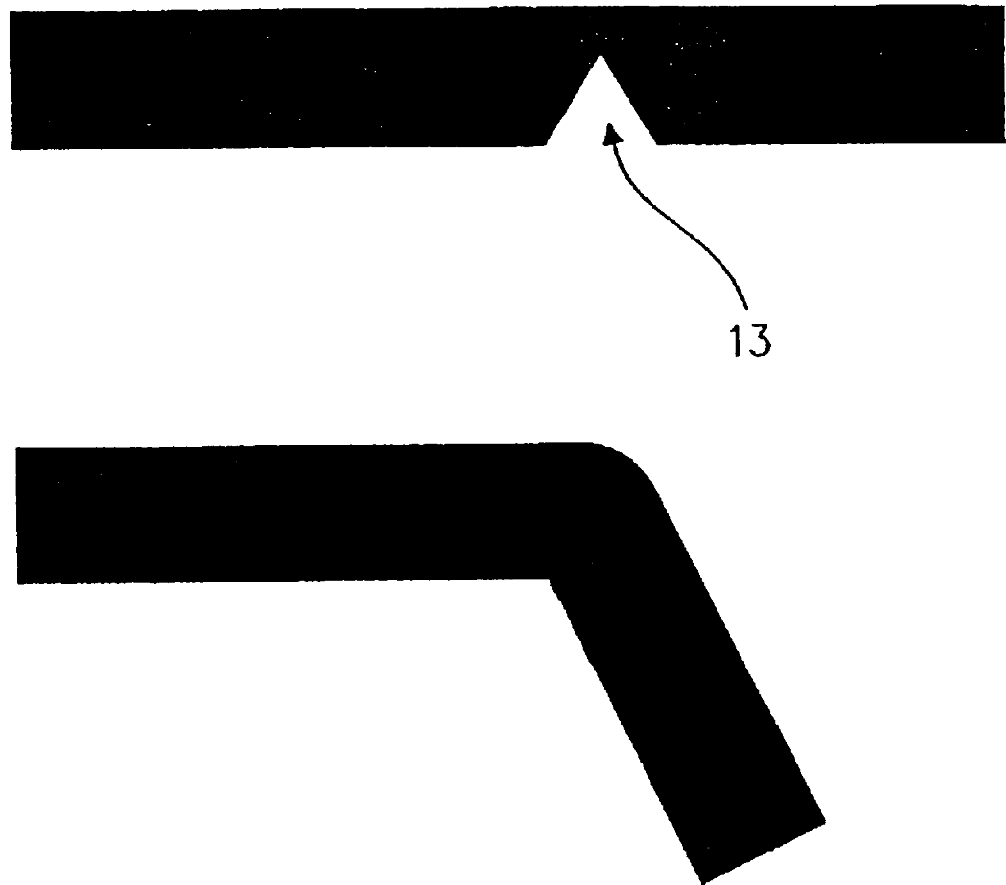
FIG. 8 is a diagrammatic illustration showing the bending of a lead frame by a prescribed angle.

FIG. 8 illustrates in detail how a lead frame can be bent, the aim being to set a prescribed angle. Firstly, an imposed shape 13 for a defined bend is formed in the lead frame. The imposed shape 13, which can be, for example, impressed or etched into the lead frame, permits a preferred bending in a desired direction and by a desired angle. The defined bending can be effected by virtue of the fact that an edge of the imposed shape 13 is used as stop, or in that use is made of a bending tool that prescribes a defined angle. This angle can additionally be stabilized by setting a suitable welding or bonding point.

Figure 9A:
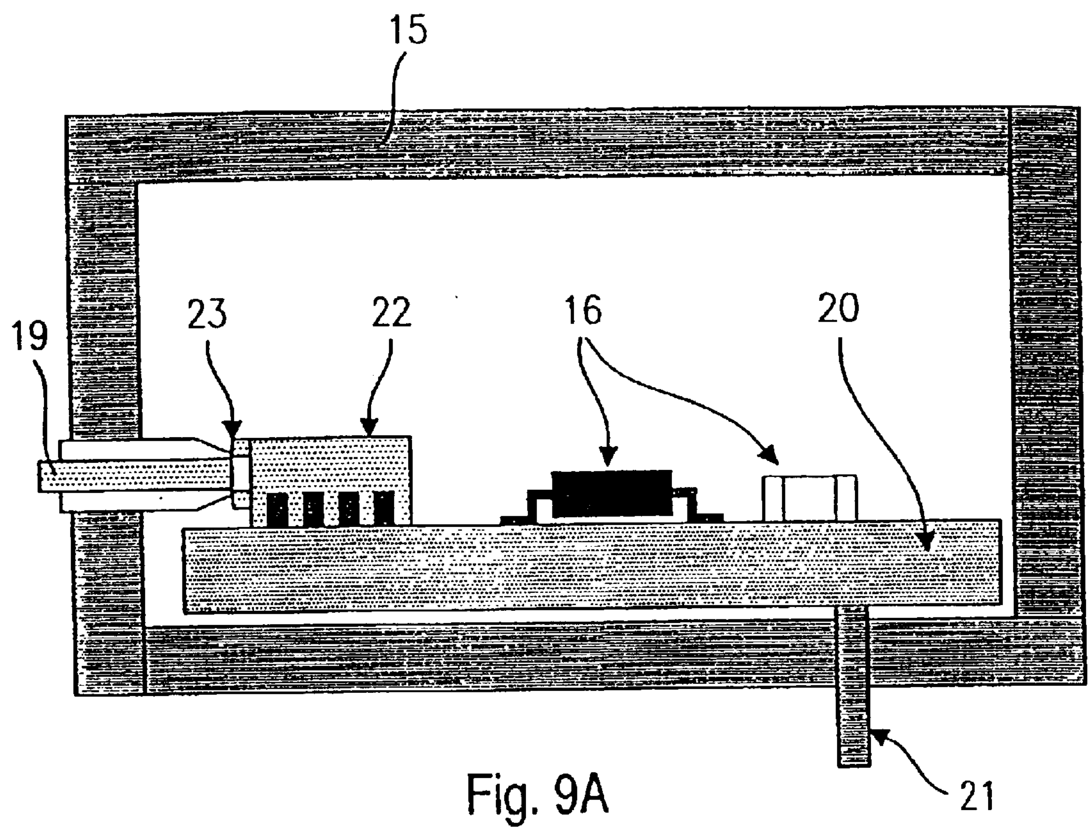
FIG. 9A is a sectional view showing an optical transmitting and/or receiving unit constructed as a sidelooker, having a seventh embodiment of a transmitting and/or receiving module according to the invention.

An electrooptical transmitting and/or receiving unit and an electrooptical transmitting and/or receiving module 22 inserted therein are illustrated in FIGS. 9A, B and 10A, B. Firstly, FIG. 9A shows an overall view of the transmitting and/or receiving unit in a longitudinal section through a circuit board 20 and a coupled optical fiber 19. Illustrated in FIG. 9A is a circuit board 20 that can be fabricated, for example, from a PC (printed circuit) board (for example FR4, FR5), and can have electronic components 16 inserted. A seventh embodiment of a transmitting and/or receiving module 22 according to the invention is applied to an end section of the circuit board 20 and coupled to an optical fiber 19 with an optical interface 23. The optical fiber 19 and connecting pins 21 of the circuit board 20 are led to the outside through openings in a housing 15 surrounding the transmitting and/or receiving unit. Since the light is launched or coupled out through a side wall of the housing, that is to say in a direction parallel to the circuit board 20, such a unit is usually also denoted as a “sidelooker”.

Figure 9B:
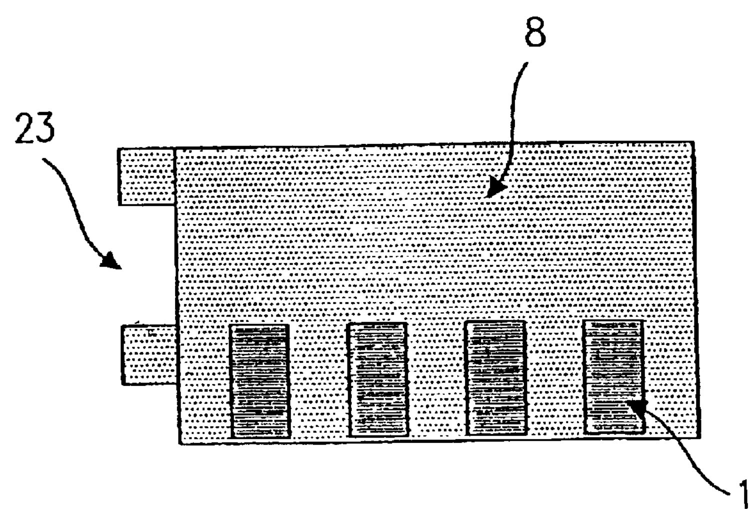
FIG. 9B is an enlarged illustration of the transmitting and/or receiving module, of the seventh embodiment, used in the transmitting and/or receiving unit of FIG. 9A.
Figure 10A:
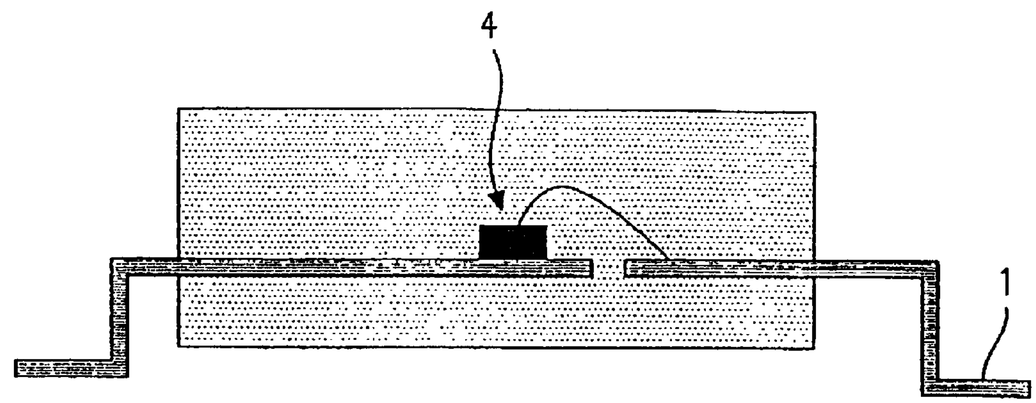
FIGS. 10A, B are a sectional view and a top view, respectively, of the embodiment of the transmitting and/or receiving module according to the invention used in the transmitting and/or receiving unit of FIG. 9A.

A seventh embodiment of an electrooptical transmitting and/or receiving module according to the invention, which is shown in an enlarged illustration in FIG. 9B, is inserted into the electrooptical transmitting and/or receiving unit. By contrast with the previously illustrated embodiments, this module is constructed as a surface-mountable module. It has like these a shaped body 8 from which the connecting pins 1 of a lead frame are led out laterally and form connecting surfaces lying in a common mounting plane. This is illustrated in FIG. 10A, which shows a cross section along a lead frame on which a transmitter 4 is fastened. The optical interface 23 shown in FIG. 9B can be constructed as a so-called insertion socket that is shaped into a functional surface of the shaped body 8 and permits an optical conductor plug to be fitted.

Figure 10B:
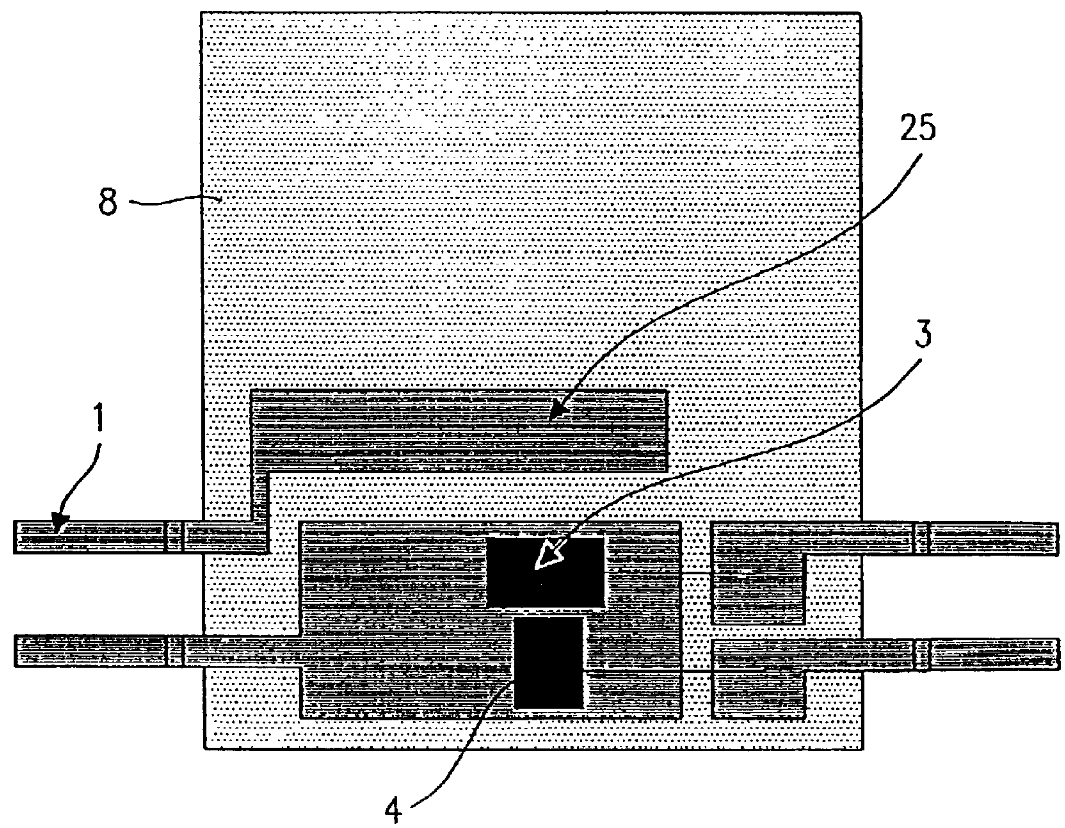

It is shown in the top view of FIG. 10B that a monitoring diode 3 is mounted with the transmitter 4 on the same lead frame. Moreover, a reflector element 25 shaped from a lead frame and below which a receiver is located is located at a further distance from the light entrance or light exit surface of the module. In the case of this embodiment, the transmitter 4 therefore emits a radiation beam directed straight into the optical fiber 19 without beam deflection, while a received radiation beam reaches a receiver by beam deflection at the reflector element 25.

Figure 11A:
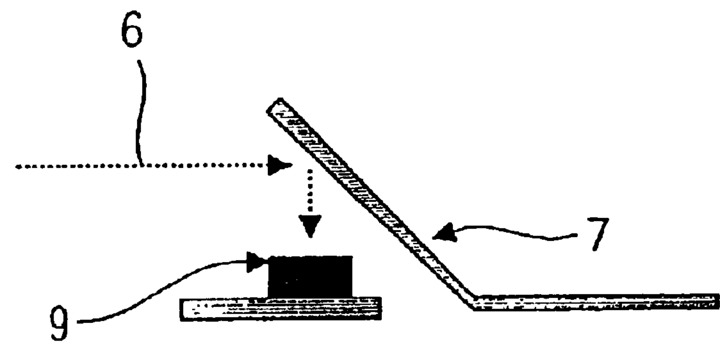
FIGS. 11A, B, C show a receiving module as eighth embodiment of a transmitting and/or receiving module according to the invention in a side view (FIG. 11A), a top view of an intermediate product (FIG. 11B), and an enlarged top view of the finished module (FIG. 11C)
Figure 11B:
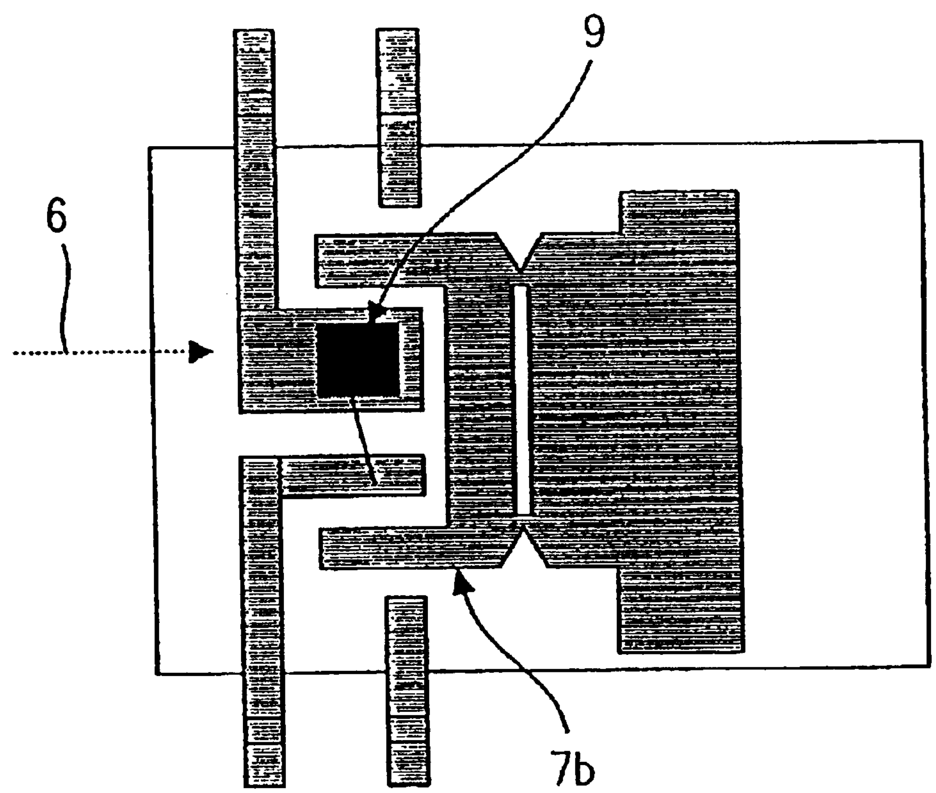
Figure 11C:
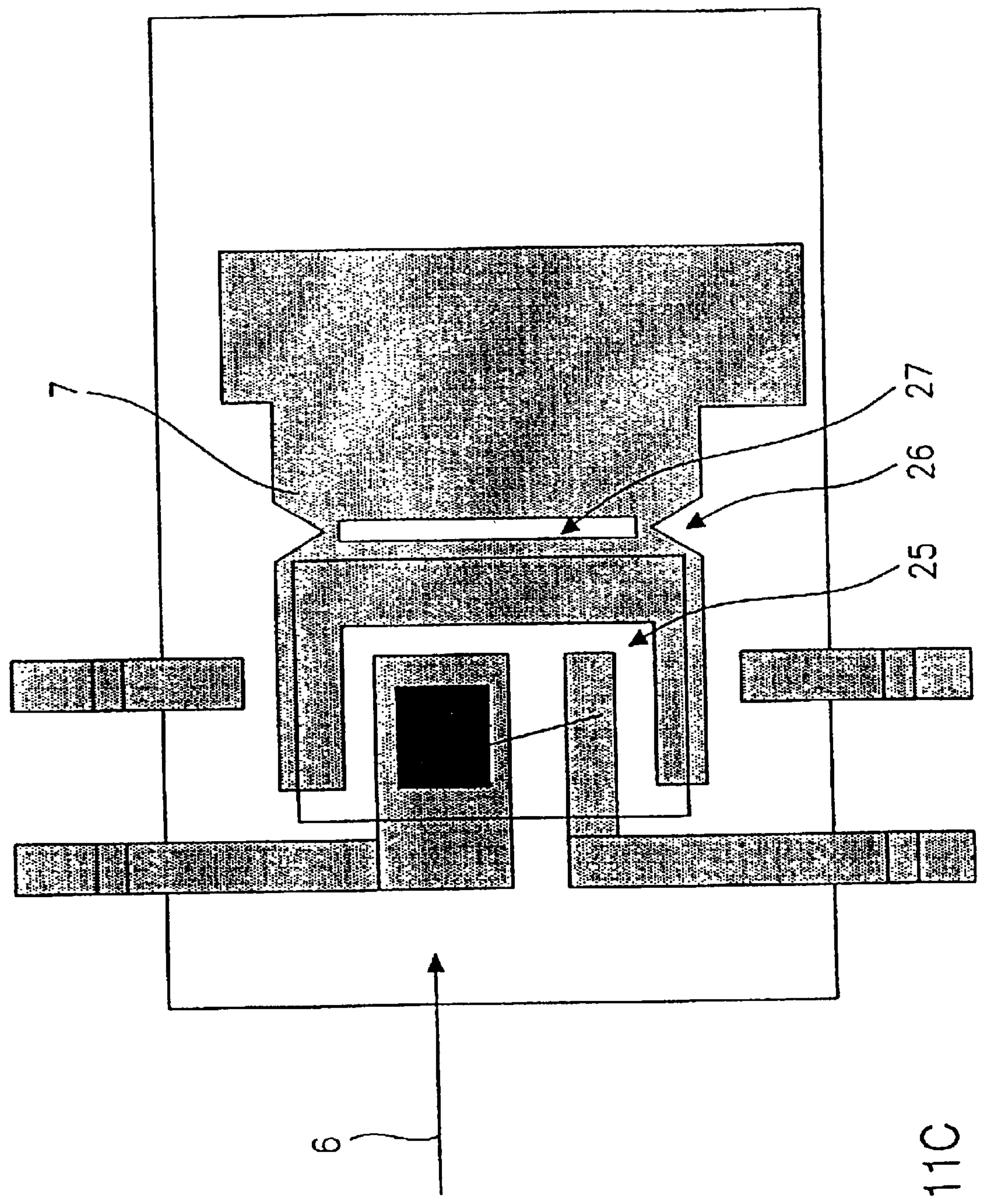

Illustrated in FIGS. 11A to C and 12 are various receiver configurations that can be used, for example, in a pure receiving module as eighth embodiment. Illustrated once again diagrammatically in FIG. 11A is the basic principle, in the case of a which a received radiation beam incident along an optical axis is directed onto a receiver 9 by the reflector surface of a reflector element 7. An intermediate of a receiving module according to the invention is illustrated in a top view in FIG. 11B. There is provided in the case of this intermediate an as yet unbent lead frame 7*b* from which a reflector element 7 is formed by bending it up along an edge which is provided with a notch 26 and a cutout 27 (see FIG. 11C). The obliquely positioned surface has in this case the form of a frame, which is averted from the receiver 9. A reflecting element 25, such as a dielectrically coated mirror or the like, is applied to the surface of the frame.

Figure 12:
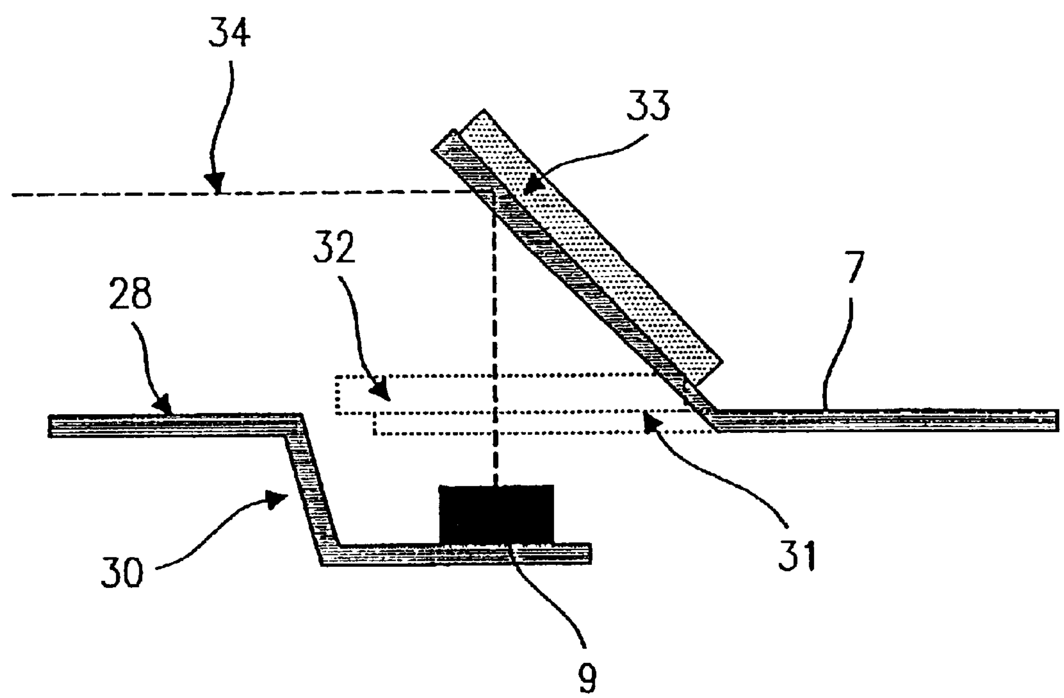
FIG. 12 is a sectional view showing a receiving module as ninth embodiment of a transmitting and/or receiving module according to the invention.

Illustrated in FIG. 12 is a further embodiment of a receiver assembly as ninth embodiment in the case of which, by contrast with the embodiment of FIG. 11A, a lead frame has an upper mounting plane 28 and a receiver 9 is mounted in a down-set region 30 produced by two bends on a lower mounting plane formed therein. In the case of this embodiment, as well, a received radiation beam falls along an optical axis 34 onto a reflecting element 33 of a reflector element 7 and is deflected in the direction of the receiver 9. The reflecting surface and the reflecting element of the reflector element 7 are illustrated by the reference numerals 31 and 32 in the state before they are bent.

The embodiment of FIG. 12 can also be used as transmitting assembly by making use of a vertically emitting semiconductor laser 9, such as a VCSEL laser diode which emits a radiation beam which is deflected onto an optical axis 34 by the reflector element 7.

It is possible in principle with all the embodiments presented here also to provide that curved reflecting surfaces of the reflector element are used such that it is possible to dispense with the separate positive lens 5 given suitable surface curvature.

Figure 13:
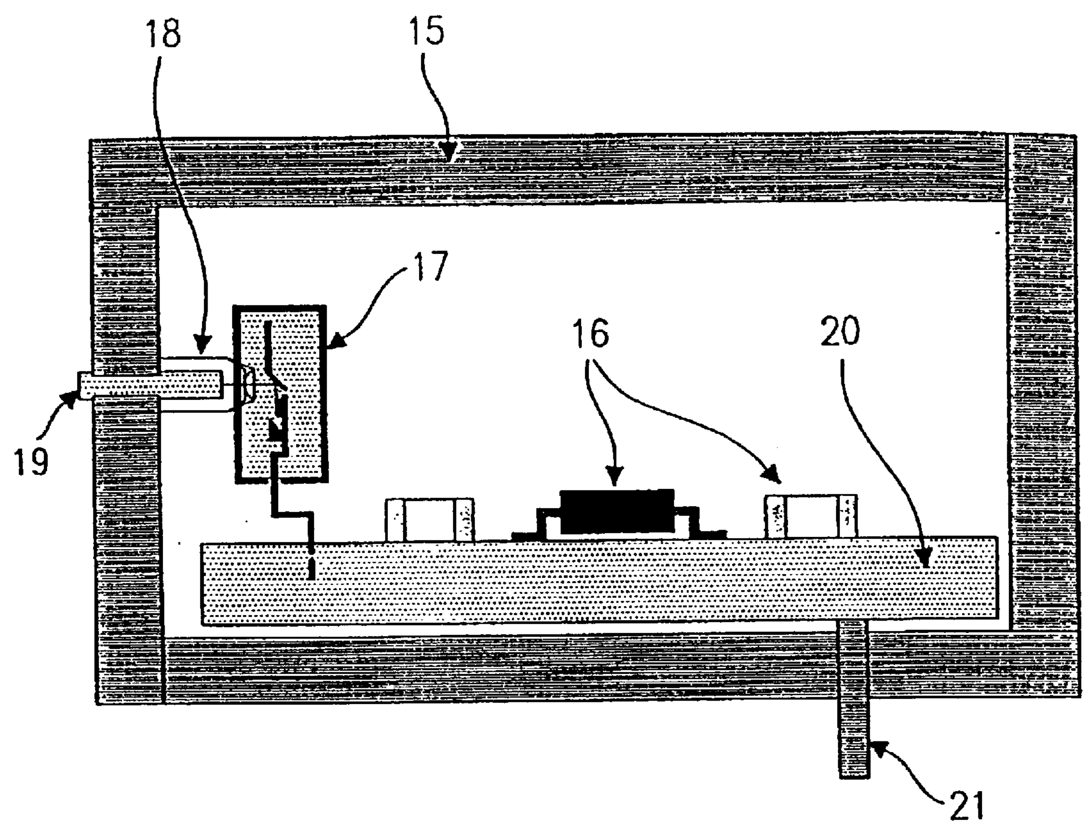
FIG. 13 is a longitudinal sectional view showing a second embodiment of an optical transmitting and/or receiving unit constructed as sidelooker, having an embodiment of a transmitting and/or receiving module according to the invention.

Finally, FIG. 13 illustrates again an electrooptical transmitting and/or receiving unit in which an embodiment of a module according to the invention is used. The module 17 used in this case corresponds substantially to the embodiment as illustrated in FIG. 4 and described further above. Thus, in contrast to the unit illustrated in FIG. 9A, use is made here of a nonsurface-mountable module which is plugged with its connecting pins 1 at right angles into a circuit board 20 and is connected at its rear or on an inner metallization plane of the circuit board 20 to conductor tracks.

We claim:

1. An electrooptical module for at least one of transmitting and receiving, comprising:

a shaped body made from a transparent, formable material and having a light entry or light exit side;

an optoelectronic transducer;

a lead frame having a section mounting said optoelectronic transducer, at least said section of said lead frame being surrounded by said shaped body; and a reflector element constructed in one piece with said lead frame and surrounded at least partially by said shaped body and having a reflecting surface facing said optoelectronic transducer at a predetermined angle to deflect a radiation beam in a light path between said optoelectronic transducer and said light entry or light exit side.

2. The module according claim 1, wherein:

said transducer is a receiver having a light-receiving surface;

said reflecting surface is disposed at a spacing above said light-receiving surface of said receiver; and said predetermined angle is 45° to said light-receiving surface.

3. The module according to claim 1, wherein said lead frame has outer connecting sections extending outside said shaped body and having connecting surfaces lying in a common mounting plane to allow surface mounting.

4. The module according to claim 1, further comprising a lens formed on said light entry or light exit side of the shaped body.

5. The module according to claim 1, further comprising a module housing surrounding said shaped body and having on said light entry or light exit side an opening formed therein.

6. The module according to claim 5, further comprising an optical conductor plug integrally formed with said module housing and disposed in said opening.

7. The module according to claim 1, further comprising a heat sink supporting at least partially said lead frame and being surrounded at least partially by said shaped body.

8. The module according to claim 1, wherein said reflecting surface is produced from a reflecting element disposed on said reflector element.

9. The module according to claim 8, wherein said reflecting element is a reflecting coating or a reflecting chip.

10. The module according to claim 1, wherein:

said optoelectronic transducer is a transmitter emitting a radiation bundle at an incidence direction; and said predetermined angle of said reflecting surface is 45° to the incidence direction of the radiation bundle emitted by said transmitter.

11. The module according to claim 10, wherein said transmitter is a semiconductor laser.

12. The module according to claim 10, wherein:

said section of said lead frame is an end section;

said transmitter is an edge-emitting semiconductor laser mounted on said end section of said lead frame; and said reflecting surface is disposed in said incidence direction at a spacing from said transmitter.

13. The module according to claim 10, wherein:

said transmitter is a vertically emitting semiconductor laser; and said reflecting surface is disposed above said transmitter at a spacing from said transmitter.

14. The module according claim 1, further comprising:

a transmitter mounted on a section of said lead frame; and a receiver mounted on a section of said lead frame;

at least one of said transmitter and said receiver being optically coupled to said reflecting surface.

15. The module according to claim 14, wherein said section of said lead frame supporting said transmitter and said section of said lead frame supporting said receiver are separated.

16. The module according to claim 14, wherein said section of said lead frame supporting said transmitter and said section of said lead frame supporting said receiver are connected.

17. A method for producing an electrooptical module having a shaped body made from a transparent formable material and a light entry or light exit side, which comprises:

mounting, on a section of a lead frame, a transmitter having a light exit surface;

mounting the transmitter onto the lead frame;

constructing, in one piece, the lead frame and a reflector element having a reflecting surface;

forming the reflector element by bending a section of the lead frame to an angle before or after the mounting of the transmitter, the section being situated upstream of the light exit surface of the transmitter;

positioning the reflector element relative to the lead frame and the optoelectronic transducer causing the reflecting surface to deflect by a predetermined angle a radiation beam in a light path between the transducer and the light entry or light exit side; and forming the shaped body by potting the first lead frame and the reflector element and encapsulating the lead frame and the reflector element with transparent formable material.

18. The method according to claim 17, which further comprises bending the section of the lead frame to a 45° angle with the plane of the lead frame.

19. The method according to claim 17, which further comprises:

sizing the lead frame to have outer connecting sections extending beyond the shaped body, the outer connecting sections having connecting surfaces; and bending the outer connecting sections after the forming of the shaped body to dispose the connecting surfaces of the outer connecting sections in a common mounting plane.

20. A method for producing an electrooptical module having a shaped body made from a transparent formable material and a light entry or light exit side, which comprises:

mounting an optoelectronic transducer on a section of a lead frame;

positioning a reflector element having a reflecting surface relative to the lead frame and the optoelectronic transducer causing the reflecting surface to deflect by a predetermined angle a radiation beam in a light path between the transducer and the light entry or light exit side;

forming the shaped body by potting the first lead frame and the reflector element and encapsulating the lead frame and the reflector element with transparent formable material; and forming the reflector element from a further lead frame by bending a section of the further lead frame to an angle.

21. The method according to claim 20, which further comprises bending the section of the further lead frame to 45°.

22. The method according to claim 20, which further comprises:

sizing the lead frame to have outer connecting sections extending beyond the shaped body, the outer connecting sections having connecting surfaces; and bending the outer connecting sections after the forming of the shaped body to dispose the connecting surfaces of the outer connecting sections in a common mounting plane.

23. A method for producing an electrooptical module having a shaped body made from a transparent formable material and a light entry or light exit side, which comprises:

mounting an optoelectronic transducer on a section of a lead frame;

positioning a reflector element having a reflecting surface relative to the lead frame and the optoelectronic transducer causing the reflecting surface to deflect by a predetermined angle a radiation beam in a light path between the transducer and the light entry or light exit side;

forming the shaped body by potting the first lead frame and the reflector element and encapsulating the lead frame and the reflector element with transparent formable material;

disposing the first lead frame and the reflector element positioned relative thereto into a mold; and injecting the transparent formable material into the mold.

24. The method according to claim 23, which further comprises removing the mold after the forming of the shaped body.

25. The method according to claim 23, which further comprises:

forming an opening in the mold at a position corresponding to the light entry or light exit side;

placing a shaped part in the opening, the shaped part having an inner side corresponding to an outer contour of a lens to be formed; and removing the shaped part after the forming of the shaped body.

26. The method according to claim 23, which further comprises retaining the mold as a module housing after the forming of the shaped body.

27. The method according to claim 23, which further comprises:

sizing the lead frame to have outer connecting sections extending beyond the shaped body, the outer connecting sections having connecting surfaces; and bending the outer connecting sections after the forming of the shaped body to dispose the connecting surfaces of the outer connecting sections in a common mounting plane.

28. An electrooptical module for at least one of transmitting and receiving, comprising:

a shaped body made from a transparent, formable material and having a light entry or light exit side;

an optoelectronic transducer;

a lead frame having a section mounting said optoelectronic transducer, at least said section of said lead frame being surrounded by said shaped body;

a reflector element surrounded at least partially by said shaped body and having a reflecting surface facing said optoelectronic transducer at a predetermined angle to deflect a radiation beam in a light path between said optoelectronic transducer and said light entry or light exit side; and a further lead frame separated from said lead frame, said reflector element being produced from said further lead frame.

29. The module according to claim 28, further comprising a lens formed on said light entry or light exit side of the shaped body.

30. The module according to claim 28, further comprising a module housing surrounding said shaped body and having on said light entry or light exit side an opening formed therein.

31. The module according to claim 30, further comprising an optical conductor plug integrally formed with said module housing and disposed in said opening.

32. The module according to claim 28, further comprising a heat sink supporting at least partially said lead frame and being surrounded at least partially by said shaped body.

33. The module according to claim 28, wherein said reflecting surface is produced from a reflecting element disposed on said reflector element.

34. The module according to claim 33, wherein said reflecting element is a reflecting coating or a reflecting chip.

35. The module according to claim 28, wherein:

said optoelectronic transducer is a transmitter emitting a radiation bundle at an incidence direction; and said predetermined angle of said reflecting surface is 45° to the incidence direction of the radiation bundle emitted by said transmitter.

36. The module according to claim 35, wherein said transmitter is a semiconductor laser.

37. The module according to claim 35, wherein:

said section of said lead frame is an end section;

said transmitter is an edge-emitting semiconductor laser mounted on said end section of said lead frame; and said reflecting surface is disposed in said incidence direction at a spacing from said transmitter.

38. The module according to claim 35, wherein:

said transmitter is a vertically emitting semiconductor laser; and said reflecting surface is disposed above said transmitter at a spacing from said transmitter.

39. The module according claim 28, wherein:

said transducer is a receiver having a light-receiving surface;

said reflecting surface is disposed at a spacing above said light-receiving surface of said receiver; and said predetermined angle is 45° to said light-receiving surface.

40. The module according claim 28, further comprising:

a transmitter mounted on a section of said lead frame; and a receiver mounted on a section of said lead frame;

at least one of said transmitter and said receiver being optically coupled to said reflecting surface.

41. The module according to claim 40, wherein said section of said lead frame supporting said transmitter and said section of said lead frame supporting said receiver are connected.

42. The module according to claim 40, wherein said section of said lead frame supporting said transmitter and said section of said lead frame supporting said receiver are separated.

43. The module according to claim 28, wherein said lead frame has outer connecting sections extending outside said shaped body and having connecting surfaces lying in a common mounting plane to allow surface mounting.

* * * * *